(12) United States Patent
Lin

(10) Patent No.: US 12,052,005 B2
(45) Date of Patent: Jul. 30, 2024

(54) TRANSCONDUCTANCE AMPLIFIER OF HIGH LINEARITY AND COMMON-MODE REJECTION

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 225 days.

(21) Appl. No.: 17/716,004

(22) Filed: Apr. 8, 2022

(65) Prior Publication Data

US 2023/0327620 A1 Oct. 12, 2023

(51) Int. Cl.
H03F 3/45 (2006.01)

(52) U.S. Cl.
CPC ..... H03F 3/45179 (2013.01); H03F 3/45748 (2013.01); *H03F 2200/372* (2013.01); *H03F 2203/45288* (2013.01)

(58) Field of Classification Search
CPC ............. H03F 3/45179; H03F 3/45748; H03F 2200/372; H03F 2203/45288; H03F 2203/45198; H03F 1/0205; H03F 2203/45258; H03F 2203/45638; H03F 2203/45704; H03F 2203/45714; H03F 2203/45724; H03F 1/3211; H03F 3/45197; H03F 3/3205; H03F 2200/498

USPC .................................................. 330/253, 254
See application file for complete search history.

(56) References Cited

U.S. PATENT DOCUMENTS

| | | | | |
|---|---|---|---|---|
| 7,034,606 B2 * | 4/2006 | Caresosa | ............... | H03G 1/007 327/563 |
| 7,378,908 B2 * | 5/2008 | Suh | ...................... | H03G 1/0029 330/254 |
| 10,892,717 B2 | 1/2021 | Lin | | |
| 2012/0025911 A1 * | 2/2012 | Zhao | ...................... | H03F 1/223 330/250 |

* cited by examiner

*Primary Examiner* — Andrea Lindgren Baltzell
*Assistant Examiner* — Khiem D Nguyen
(74) *Attorney, Agent, or Firm* — McClure, Qualey & Rodack, LLP

(57) ABSTRACT

A transconductance amplifier includes a first MOS transistor configured to receive a first voltage at a first node and output a first current to a fifth node in accordance with a third voltage at a third node; a second MOS transistor configured to receive a second voltage at a second node and output a second current to a sixth node in accordance with a fourth voltage at a fourth node; a third MOS transistor configured to output a third current to the third node in accordance with a fifth voltage at the fifth node; a fourth MOS transistor configured to output a fourth current to the fourth node in accordance with a sixth voltage at the sixth node; and a source degeneration network placed across the third node and the fourth node.

20 Claims, 4 Drawing Sheets

TRANSCONDUCTANCE AMPLIFIER OF HIGH LINEARITY AND COMMON-MODE REJECTION

BACKGROUND OF THE DISCLOSURE

Field of the Disclosure

This present disclosure generally relates to transconductance amplifiers, and more particularly to transconductance amplifiers that allow high linearity and common-mode rejection without having a large parasitic capacitance.

Description of Related Art

A transconductance amplifier receives a voltage signal and outputs a current signal accordingly. Ideally, an incremental change of the voltage signal will lead to a proportionally incremental change of the current signal. A non-ideality known as "nonlinearity" is exhibited when an incremental change of the current signal is not strictly proportional to the incremental change of the voltage signal. Note that in a differential signal embodiment, a voltage signal comprises a first voltage and a second voltage, while a current signal comprises a first current and a second current. As depicted in FIG. 1, a prior art transconductance amplifier 100 in a differential signal embodiment comprises: a first NMOS (n-channel metal oxide semiconductor) transistor 111 configured to receive a first voltage $V_p$ and output a first current $I_p$, and a second NMOS transistor 112 configured to receive a second voltage $V_n$ and output a second current $I_n$. Here, $V_p$ and $V_n$ jointly define a voltage signal, and $I_p$ and $I_n$ jointly define a current signal. $I_p$ and $I_n$ are received by a load 120, which comprises a first resistor 121 and a second resistor 122 configured to receive $I_p$ and $I_n$, respectively. Throughout this disclosure, "$V_{DD}$" denotes a power supply voltage.

An issue of the prior art transconductance amplifier 100 is: the linearity is usually not good, unless the two NMOS transistors 111 and 112 have a long channel length. Using a long channel length for the two NMOS transistors 111 and 112, however, leads a large parasitic capacitance, and adversely limits the speed of the transconductance amplifier 100.

In addition, prior art transconductance amplifier 100 has a high common-mode gain and consequently a poor common-mode rejection. A common-mode gain is defined by an incremental change of $I_p$ and $I_n$ in response to an incremental change of $V_p$ and $V_n$, when $V_p$ and $V_n$ are tied together and have the same level.

In U.S. Pat. No. 10,892,717, Lin discloses a transconductance amplifier that allows high linearity without having a large parasitic capacitance but does not effectively address the poor common-mode rejection issue.

What is desired is a transconductance amplifier that allows high linearity and high common-mode rejection without having a large parasitic capacitance.

SUMMARY OF THE DISCLOSURE

In an embodiment, a transconductance amplifier comprises: a first MOS (metal-oxide semiconductor) transistor configured to receive a first voltage at a first node and output a first current to a fifth node in accordance with a third voltage at a third node; a second MOS transistor configured to receive a second voltage at a second node and output a second current to a sixth node in accordance with a fourth voltage at a fourth node; a third MOS transistor configured to output a third current to the third node in accordance with a fifth voltage at the fifth node; a fourth MOS transistor configured to output a fourth current to the fourth node in accordance with a sixth voltage at the sixth node; and a source degeneration network that is placed across the third node and the fourth node and comprises a parallel connection of a source resistor, a fifth MOS transistor controlled by the first voltage, and a sixth MOS transistor controlled by the second voltage.

In an embodiment, a transconductance amplifier comprises: a first MOS (metal-oxide semiconductor) transistor, a second MOS transistor, a third MOS transistor, a fourth MOS transistor, and a source degeneration network, wherein: a gate, a source, and a drain of the first MOS transistor connect to a first node, a third node, and a fifth node, respectively; a gate, a source, and a drain of the second MOS transistor connect to a second node, a fourth node, and a sixth node, respectively; a gate, a source, and a drain of the third MOS transistor connect to the fifth node, a DC (direct-current) node, and the third node, respectively; a gate, a source, and a drain of the fourth MOS transistor connect to the sixth node, the DC node, and the fourth node, respectively; and the source generation network is placed across the third node and the fourth node and comprises a parallel connection of a source resistor, a fifth MOS transistor controlled by a first voltage at the first node, and a sixth MOS transistor controlled by a second voltage at the second node.

DETAILED DESCRIPTION OF THIS DISCLOSURE

Figure 1:
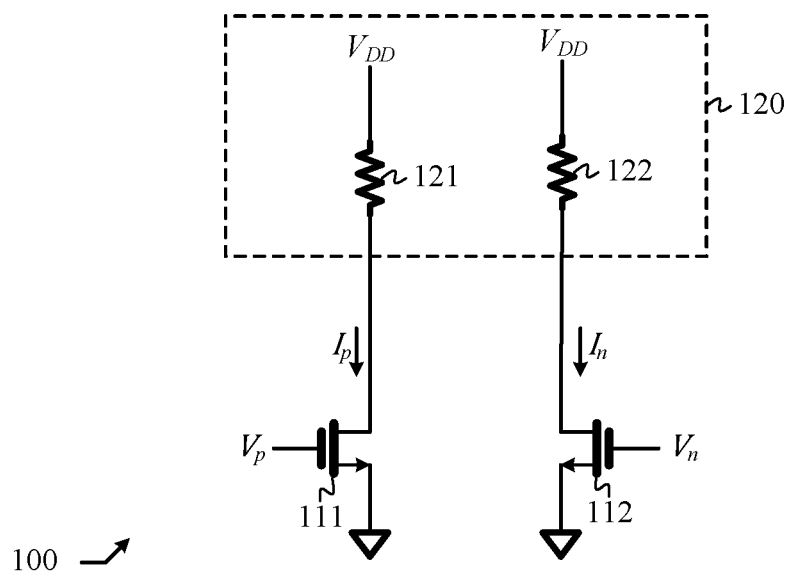
FIG. 1 shows a schematic diagram of a prior art transconductance amplifier.

The present disclosure is directed to transconductance amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "transconductance," "amplifier," "differential signal," "common-mode," "load," "resistor," "capacitor," "inductor" "impedance," "parallel connection," "circuit node," "ground," "DC (direct-current)," "AC (alternate-current),"

"switch," "open circuit," "short circuit," "mixer," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art can read circuit schematics and have a fully understanding of electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of components such as transistors, capacitors, resistors, and/or other electronic devices interconnected in a certain manner to embody a certain function.

A network is a circuit or a collection of circuits.

In this disclosure, a DC (direct-current) node refers to a node of a substantially stationary voltage level. Power supply node and ground node are both DC nodes but differ in voltage level; a voltage level of a power supply node is higher than a voltage level of a ground node.

In this disclosure, a "circuit node" is frequently simply stated as a "node" for short, when what it means is clear from a context.

A signal is either a voltage or a current of a variable level that carries a certain information and can vary with time. A level of the signal at a moment represents a state of the signal at that moment.

A signal is said to be output from a first device to a second device when a change of said signal is originated and dictated by the first device while the second device merely passively reacts to the change of said signal and is said to be receiving said signal.

A logical signal is a voltage signal of two states: a low state and a high state. Regarding a logical signal Q, "Q is high" or "Q is low," means "Q is in the high state" or "Q is in the low state."

A logical signal is often used as a control signal to enable or disable a function of a circuit. When the logical signal is in a logical state that enables the function of the circuit, the logical signal is said to be "asserted"; otherwise, the logical signal is said to be "de-asserted." When a logical signal is "asserted" when it is high, it is said to be "active high"; when a logical signal is "asserted" when it is low, it is said to be "active low."

A first logical signal is said to be a logical inversion of a second logical signal if the first logical signal and the second logical signal always have opposite states. That is, when the first logical signal is high, the second logical signal will be low; when the first logical signal is low, the second logical signal will be high. When a first logical signal is a logical inversion of a second logical signal, the first logical signal is said to be complementary to the second logical signal.

A switch is a device configured to provide connection between a first node and a second node in accordance with a logical signal; said switch is effectively a short circuit when the logical signal is asserted; and said switch is effectively an open circuit when the logical signal is de-asserted.

A clock is a logical signal that periodically toggles back and forth between a low state and a high state.

Figure 2:
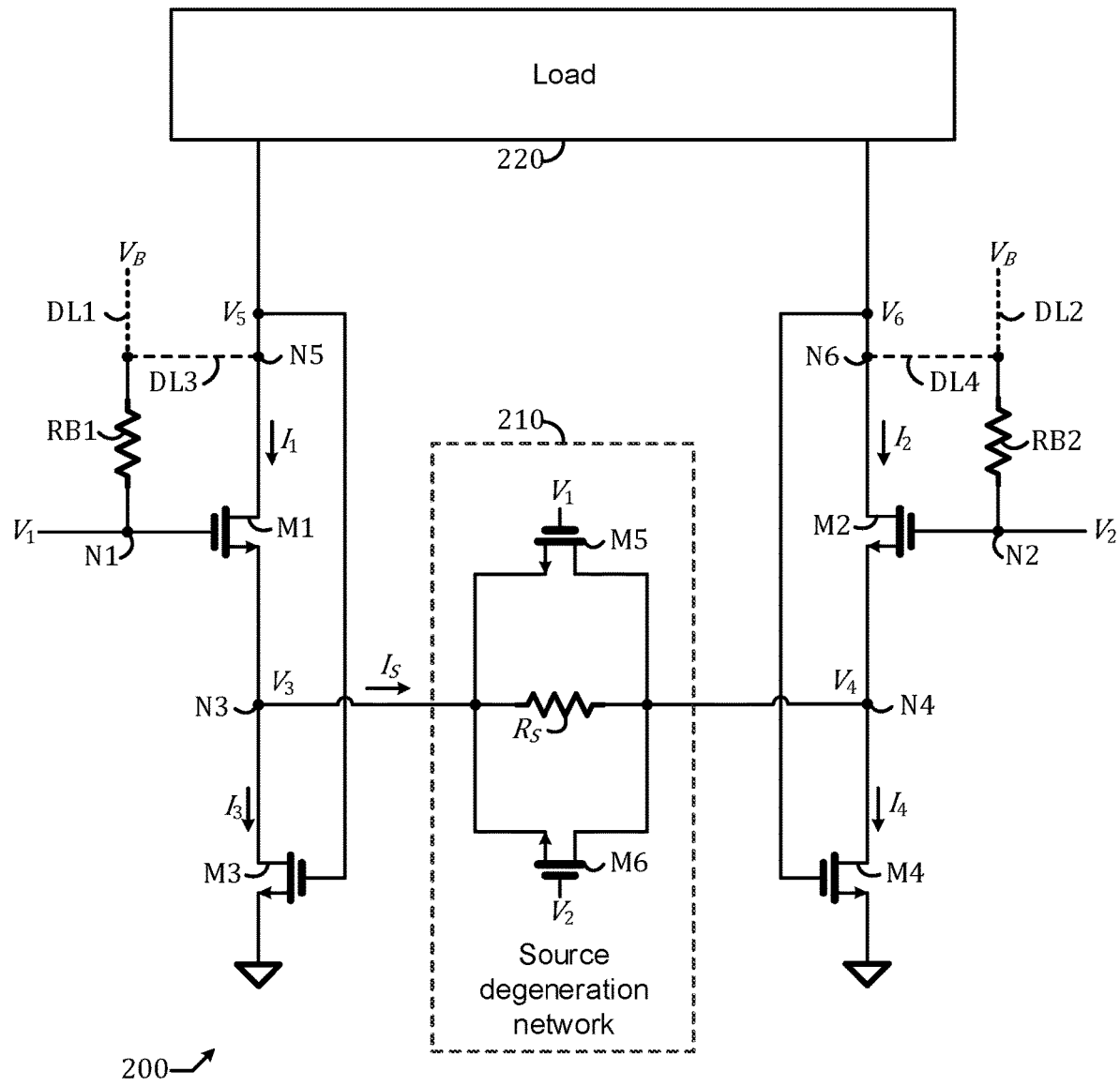
FIG. 2 shows a schematic diagram of a transconductance amplifier in accordance with an embodiment of the present disclosure.

A schematic diagram of a transconductance amplifier 200 in accordance with an embodiment of the present disclosure is shown in FIG. 2. Transconductance amplifier 200 is configured to receive a first voltage $V_1$ at a first node N1 and a second voltage $V_2$ at a second node N2 and output a first current $I_1$ and a second current $I_2$ to a load 220 through a fifth node N5 and a sixth node N6, respectively, and comprises: a first NMOS transistor M1, a second NMOS transistor M2, a third NMOS transistor M3, a fourth NMOS transistor M4, and a source degeneration network 210, wherein: a gate, a source, and a drain of NMOS transistor M1 connect to the first node N1, a third node N3, and the fifth node N5, respectively; a gate, a source, and a drain of NMOS transistor M2 connect to the second node N2, a fourth node N4, and the sixth node N6, respectively; a gate, a source, and a drain of NMOS transistor M3 connect to the fifth node N5, ground, and the third node N3, respectively; a gate, a source, and a drain of NMOS transistor M4 connect to the sixth node N6, ground, and the fourth node N4, respectively; and the source degeneration network 210 is placed across the third node N3 and the fourth node N4.

The source degeneration network 210 comprises a parallel connection of a resource degeneration resistor $R_S$, a fifth NMOS transistor M5 controlled by the first voltage $V_1$, and a sixth NMOS transistor M6 controlled by the second voltage $V_2$. An impedance $Z_{sdn}$ of the source degeneration network 210 can be written:

$$Z_{sdn} = \frac{1}{\frac{1}{R_S} + \frac{1}{R_{on5}} + \frac{1}{R_{on6}}} \tag{1}$$

Here, $R_{on5}$ is a resistance of NMOS M5 transistor and is controlled by $V_1$, while $R_{on6}$ is a resistance of NMOS transistor M6 and is controlled by $V_2$.

Transconductance amplifier 200 is a balanced circuit; that is, NMOS transistors M1 and M2 are identical, NMOS transistors M3 and M4 are identical, NMOS transistors M5 and M6 are identical, and an impedance looking from node N5 into load 220 is the same as an impedance looking from node N6 into load 220. Let a transconductance of NMOS transistors M1 and M2 be $g_{m1}$ and a transconductance of NMOS transistors M3 and M4 be $g_{m2}$. Let the impedance looking from node N5 into load 220 be $Z_L$, which is the same as the impedance looking from node N6 into load 220.

NMOS transistor M1 embodies a first source follower biased by a third current $I_3$, which is provided by NMOS transistor M3 and controlled by $V_5$ in a negative feedback manner to ensure $V_3$ can follow $V_1$ closely. Likewise, NMOS transistor M2 embodies a second source follower biased by a fourth current $I_4$, which is provided by NMOS transistor M4 and controlled by $V_6$ in a negative feedback manner to ensure $V_4$ can follow $V_2$ closely.

In a differential-mode signal scenario, an increase of $V_1$ of an amount $\Delta V$ always accompanies a decrease of $V_2$ of the same amount $\Delta V$. Mathematically, one can derive that $V_3$ will increase by an amount $\delta V_3$ that can be expressed by $$\delta V_3 = \Delta V \cdot g_{m1} Z_S / (1 + g_{m1} Z_S (1 + g_{m2} Z_L)) \tag{2}$$

In the meanwhile, $V_4$ will decrease by the same amount of $\delta V_3$. Here, $Z_S$ is a half impedance of the source degeneration network 210 and equal to $Z_{sdn}/2$. One can also derive that $I_1$ will increase by an amount $\delta I_1$ that can be expressed by $$\delta I_1 = \Delta V \cdot g_{m1}/(1+g_{m1}Z_S(1+g_{m2}Z_L)) \quad (3)$$

In the meanwhile, $I_2$ will decrease by the same amount of $\delta I_1$. Here, $(1+g_{m2}Z_L)$ is a loop gain of the negative feedback provided by NMOS transistors M3 and M4. In an embodiment, the negative feedback has a sufficiently large gain, so that the following condition holds:

$$g_{m1}Z_S(1+g_{m2}Z_L) \gg 1 \quad (4)$$

Consequently, equation (3) can be simplified to $$\delta I_1 = \Delta V/(Z_S(1+g_{m2}Z_L)) \quad (5)$$

The dependence of $\delta I_1$ on $g_{m1}$ is thus eliminated, and nonlinearity of NMOS transistors M1 and M2 is thus effectively alleviated. This allows transconductance amplifier 200 to have high linearity without the need of using a long channel length device for NMOS transistors M1 and M2. However, the term $Z_S(1+g_{m2}Z_L)$ could still contribute to nonlinearity. An increase of $V_1$ leads to an increase of $I_3$ and consequently an increase of both $1/R_{on5}$ and the transconductance of NMOS transistor M3. In the meanwhile, a decrease of $V_2$ leads to a decrease of $I_4$ and consequently a decrease of both $1/R_{on6}$ and the transconductance of NMOS transistor M4. Thanks to a quadratic law of MOS transistors, as $\Delta V$ becomes larger, the increase of the transconductance of NMOS transistor M3 will be greater than the decrease of the transconductance of NMOS transistor M4, causing an increase to an effective value of $g_{m2}$ and thus an effective increase of the term $(1+g_{m2}Z_L)$. However, the increase of $1/R_{on5}$ is also larger than the decrease of $1/R_{on6}$, causing a decrease of $Z_S$. A nonlinearity of $Z_S (1+g_{m2}Z_L)$ is thus alleviated because an increase to $(1+g_{m2}Z_L)$ is remedied by the decrease of $Z_S$.

In a common-mode signal scenario, $V_1$ and $V_2$ are always of the same level, thus $V_3$ and $V_4$ are always of the same level, causing the source current $I_S$ flowing through the source degeneration network 210 to be always zero and the source degeneration network 210 becomes an effectively open circuit and has an infinite impedance. When both $V_1$ and $V_2$ increase by an amount $\Delta V$, both $I_1$ and $I_2$ will remain unchanged in a first order approximation that ignores an output resistance of NMOS transistors M1, M2, M3, and M4. Therefore, transconductance amplifier 200 can have a very high common-mode rejection.

In an embodiment, $V_1$ and $V_2$ are received from a preceding circuit through AC (alternate-current) coupling. In an embodiment wherein signal connections represented by dashed lines DL1 and DL2 are solid connections while signal connections represented by dashed lines DL3 and DL4 are broken, transconductance amplifier 200 further comprises a first bias resistor RB1 and a second bias resistor RB2 configured to couple a bias voltage $V_B$ to nodes N1 and N2, respectively, so that NMOS transistors M1 and M2 are biased in accordance with the bias voltage $V_B$. In another embodiment wherein signal connections represented by dashed lines DL1 and DL2 are broken while signal connections represented by dashed lines DL3 and DL4 are both solid connections, node N1 is coupled to node N5 through bias resistor RB1, node N2 is coupled to node N6 through bias resistor RB2, and NMOS transistors M1 and M2 are said to be "self-biased."

In a yet another embodiment, $V_1$ and $V_2$ are received from a preceding circuit through DC (direct-current) coupling. In this case, resistors RB1 and RB2 are not needed, and the signal connections represented by dashed lines DL1, DL2, DL3, and DL4 are all broken.

For transconductance amplifier 200 to work well, NMOS transistors M1, M2, M3, and M4 must all remain in saturation region. NMOS transistors M1 and M2 can remain in saturation region by establishing a proper bias voltage either through $V_B$ or self-biasing in an AC coupling embodiment, or the preceding circuit must ensure a proper DC value for $V_1$ and $V_2$ in a DC coupling embodiment. NMOS transistors M3 and M4 can remain in saturation region by having an over-drive voltage larger than what NMOS transistors M1 and M2 have. (An over-drive voltage of a NMOS transistor is defined as a difference of a gate-to-source voltage and a threshold voltage of said NMOS transistor.) This can be accomplished by taking at least one, but preferably more of the following measures: first, using a high threshold voltage device for NMOS transistors M3 and M4; second, using a low threshold voltage device for NMOS transistors M1 and M2; and third, letting NMOS transistors M1 and M2 have a much larger width-to-length ratio than NMOS transistors M3 and M4.

In an embodiment, NMOS transistors M3 and M4 are high threshold voltage devices. In an embodiment, NMOS transistors M1 and M2 are low threshold voltage devices. In an embodiment, a width-to-length ratio of NMOS transistors M1 and M2 is greater than a width-to-length ratio of NMOS transistors M3 and M4. In an embodiment, a width-to-length ratio of NMOS transistors M1 and M2 is greater than a width-to-length ratio of NMOS transistors M3 and M4 by a factor that is between two and ten.

The source degeneration network 210 determines a gain of the transconductance amplifier 200. A smaller value of $R_S$ leads to a larger gain, while a larger width-to-length ratio of NMOS transistors M5 and M6 also lead to a larger gain.

Figure 3A:
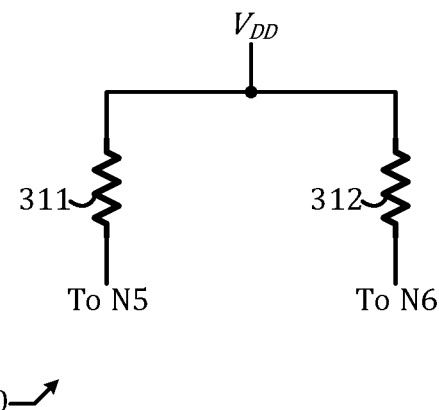
FIG. 3A shows a schematic of the load for the transconductance amplifier of FIG. 2 in accordance with an embodiment of the present disclosure.

In an embodiment shown in FIG. 3A, load 220 is embodied by a network 310 comprising two resistors 311 and 312 configured to couple a power supply node $V_{DD}$ to nodes N5 and N6, respectively.

Figure 3B:
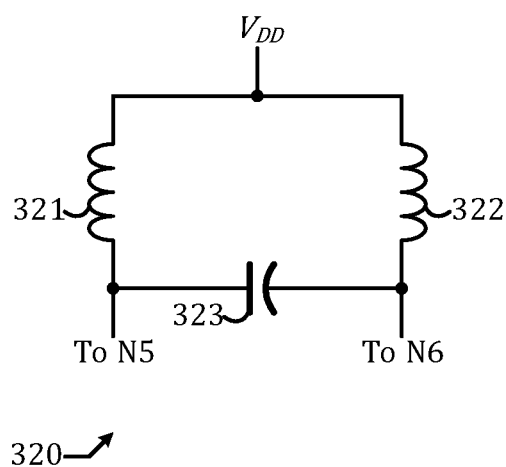
FIG. 3B shows a schematic of the load for the transconductance amplifier of FIG. 2 in accordance with another embodiment of the present disclosure.

In another embodiment shown in FIG. 3B, load 220 is embodied by a network 320 comprising two inductors 321 and 322 configured to couple a power supply node $V_{DD}$ to nodes N5 and N6, respectively, and a capacitor 323 placed across nodes N5 and N6. Network 320 is known as a LC resonant tank that is well understood by those of ordinary skill in the art and thus not explained in detail.

Figure 3C:
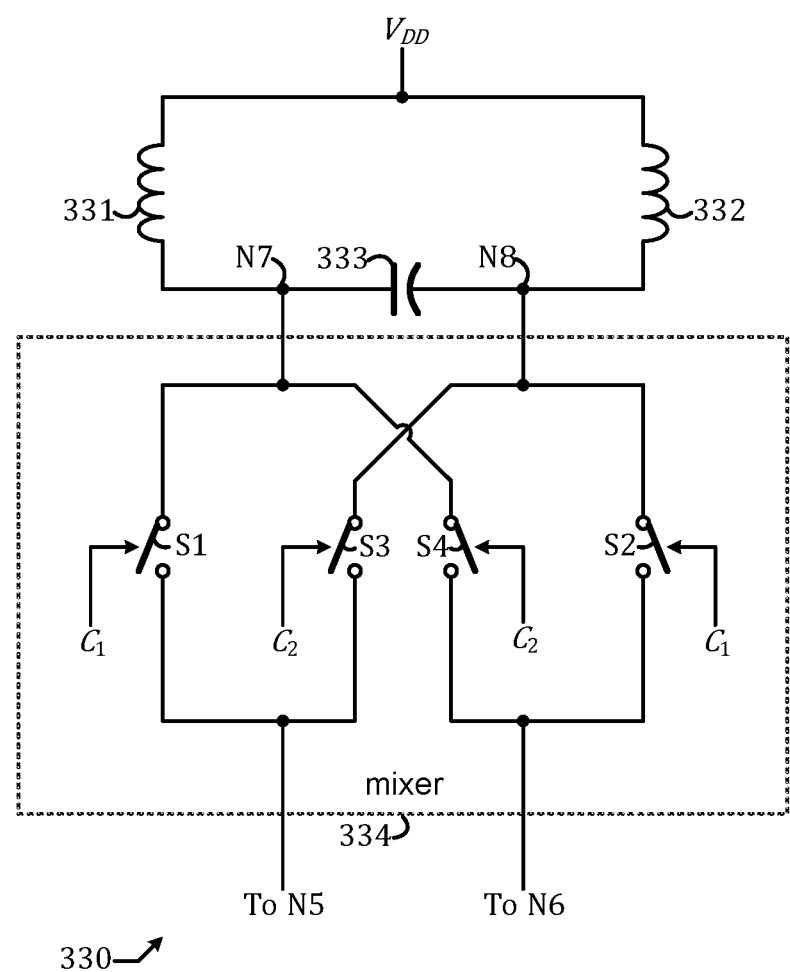
FIG. 3C shows a schematic of the load for the transconductance amplifier of FIG. 2 in accordance with yet another embodiment of the present disclosure.

In yet another embodiment shown in FIG. 3C, load 220 is embodied by a network 330 comprising two inductors 331 and 332 configured to couple a power supply node $V_{DD}$ to a seventh node nodes N7 and an eighth node N8, respectively, a capacitor 333 placed across nodes N7 and N8, and a mixer 334 configured to couple nodes N7 and N8 to nodes N5 and N6. Mixer 334 comprises a first switch S1 configured to connect N7 to N5 in accordance with a first clock $C_1$, a second switch S2 configured to connect N8 to N6 in accordance with the first clock $C_1$, a third switch S3 configured to connect N8 to N5 in accordance with a second clock $C_2$, and a fourth switch S4 configured to connect N7 to N6 in accordance with the second clock signal $C_2$. The first clock $C_1$ and the second clock $C_2$ are complementary. When $C_1$ is asserted, $C_2$ is de-asserted, N7 and N8 effectively connect to N5 and N6, respectively; when $C_1$ is de-asserted, $C_2$ is asserted, N7 and N8 effectively connect to N6 and N5, respectively. Mixer 334 is well known in the prior art and thus not further explained in detail. Also, transconductance amplifier 100 with load 220 embodied by network 330 is known as a "double side-band mixer." Those skilled in the art will understand how to construct a "single side-band mixer" by using two instances of this circuit but share the same inductors 331 and 332 and capacitor 333 in the load.

Although the arrow symbol associated with $I_1$ is shown to be pointing from load network 220 to the drain of NMOS transistor M1, it must be understood that $I_1$ is indeed a current signal output from NMOS transistor M1 to the load network 220 through node N5. That's because, it is NMOS transistor M1 that originates and dictates the change of $I_1$, while the load network 220 only passively reacts to the change of $I_1$. The direction of arrow symbol associated with $I_1$ merely denotes a current flow direction but not a signal flow direction, and it would be incorrect to interpret $I_1$ as a current signal output from the load network 220 to the NMOS transistor M1 simply because the arrow symbol shows a direction pointing from the load 220 to the NMOS transistor M1. The same thing can be said about $I_2$, $I_3$, and $I_4$.

It is well known in the prior art that, for a given circuit comprising a plurality of NMOS transistors and/or a plurality of PMOS transistors, a function of said given circuit can remain the same if every NMOS transistor is changed to a PMOS transistor, every PMOS transistor is changed to a NMOS transistor, every ground node is changed to a power node connection, and every power node is changed to a ground node connection. Therefore, in the appended claims, NMOS transistors are merely stated as "MOS transistors," and ground node is simply stated as DC node.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A transconductance amplifier comprising:
   a first MOS (metal-oxide semiconductor) transistor configured to receive a first voltage at a first node and output a first current to a fifth node in accordance with a third voltage at a third node;
   a second MOS transistor configured to receive a second voltage at a second node and output a second current to a sixth node in accordance with a fourth voltage at a fourth node;
   a third MOS transistor configured to output a third current to the third node in accordance with a fifth voltage at the fifth node;
   a fourth MOS transistor configured to output a fourth current to the fourth node in accordance with a sixth voltage at the sixth node; and
   a source degeneration network that is placed across the third node and the fourth node and comprises a parallel connection of a source resistor, a fifth MOS transistor controlled by the first voltage, and a sixth MOS transistor controlled by the second voltage.

2. The transconductance amplifier of claim 1, wherein the first voltage and the second voltage are received from a preceding circuit using DC (direct-current) coupling.

3. The transconductance amplifier of claim 1, wherein the first voltage and the second voltage are received from a preceding circuit using AC (alternate-current) coupling.

4. The transconductance amplifier of claim 3 further comprising a first bias resistor and a second bias resistor configured to couple a bias voltage to the first node and the second node, respectively.

5. The transconductance amplifier of claim 3 further comprising a first bias resistor and a second bias resistor configured to couple the first node and the second node to the fifth node and the sixth node, respectively.

6. The transconductance amplifier of claim 1 further comprising a load configured to connect to the fifth node and the sixth node.

7. The transconductance amplifier of claim 6, wherein the load comprises two resistors configured to couple a power supply node to the fifth node and the sixth node, respectively.

8. The transconductance amplifier of claim 6, wherein the load comprises two inductors configured to couple a power supply node to the fifth node and the sixth node respectively, and a capacitor across the fifth node and the sixth node.

9. The transconductance amplifier of claim 6, wherein the load comprises two inductors configured to couple a power supply node to a seventh node and an eighth node respectively, a capacitor across the seventh node and the eighth node, and a mixer configured to couple the seventh node and the eighth node to the fifth node and the sixth node in accordance with a first clock and a second clock that is complementary to the first clock.

10. The transconductance amplifier of claim 9, wherein the mixer comprises a first switch configured to connect the seventh node to the fifth node in accordance with the first clock, a second switch configured to connect the eighth node to the sixth node in accordance with the first clock, a third switch configured to connect the eighth node to the fifth node in accordance with the second clock, and a fourth switch configured to connect the seventh node to the sixth node in accordance with the second clock.

11. A transconductance amplifier comprising a first MOS (metal-oxide semiconductor) transistor, a second MOS transistor, a third MOS transistor, a fourth MOS transistor, and a source degeneration network, wherein:
   a gate, a source, and a drain of the first MOS transistor connect to a first node, a third node, and a fifth node, respectively;
   a gate, a source, and a drain of the second MOS transistor connect to a second node, a fourth node, and a sixth node, respectively;
   a gate, a source, and a drain of the third MOS transistor connect to the fifth node, a DC (direct-current) node, and the third node, respectively;
   a gate, a source, and a drain of the fourth MOS transistor connect to the sixth node, the DC node, and the fourth node, respectively; and
   the source degeneration network is placed across the third node and the fourth node and comprises a parallel connection of a source resistor, a fifth MOS transistor controlled by a first voltage at the first node, and a sixth MOS transistor controlled by a second voltage at the second node.

12. The transconductance amplifier of claim 11, wherein the first voltage and the second voltage are received from a preceding circuit using DC (direct-current) coupling.

13. The transconductance amplifier of claim 11, wherein the first voltage and the second voltage are received from a preceding circuit using AC (alternate-current) coupling.

14. The transconductance amplifier of claim 13 further comprising a first bias resistor and a second bias resistor configured to couple a bias voltage to the first node and the second node, respectively.

15. The transconductance amplifier of claim 13 further comprising a first bias resistor and a second bias resistor configured to couple the first node and the second node to the fifth node and the sixth node, respectively.

16. The transconductance amplifier of claim 11 further comprising a load configured to connect to the fifth node and the sixth node.

17. The transconductance amplifier of claim 16, wherein the load comprises two resistors configured to couple a power supply node to the fifth node and the sixth node, respectively.

18. The transconductance amplifier of claim 16, wherein the load comprises two inductors configured to couple a power supply node to the fifth node and the sixth node respectively, and a capacitor across the fifth node and the sixth node.

19. The transconductance amplifier of claim 16, wherein the load comprises two inductors configured to couple a power supply node to a seventh node and an eighth node respectively, a capacitor across the seventh node and the eighth node, and a mixer configured to couple the seventh node and the eighth node to the fifth node and the sixth node in accordance with a first clock and a second clock that is complementary to the first clock.

20. The transconductance amplifier of claim 19, wherein the mixer comprises a first switch configured to connect the seventh node to the fifth node in accordance with the first clock, a second switch configured to connect the eighth node to the sixth node in accordance with the first clock, a third switch configured to connect the eighth node to the fifth node in accordance with the second clock, and a fourth switch configured to connect the seventh node to the sixth node in accordance with the second clock.

* * * * *